United States Patent
Otsubo

(10) Patent No.: US 9,012,785 B2
(45) Date of Patent: Apr. 21, 2015

(54) FLEXIBLE MULTILAYER SUBSTRATE

(71) Applicant: Murata Manufacturing Co., Ltd., Nagaokakyo, Kyoto-fu (JP)

(72) Inventor: Yoshihito Otsubo, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 46 days.

(21) Appl. No.: 14/047,623

(22) Filed: Oct. 7, 2013

(65) Prior Publication Data

US 2014/0034365 A1    Feb. 6, 2014

Related U.S. Application Data

(63) Continuation of application No. PCT/JP2012/059515, filed on Apr. 6, 2012.

(30) Foreign Application Priority Data

Apr. 13, 2011    (JP) .................................. 2011-088967

(51) Int. Cl.
| | |
|---|---|
| H05K 1/00 | (2006.01) |
| H05K 1/02 | (2006.01) |
| H05K 1/03 | (2006.01) |
| H05K 1/09 | (2006.01) |

(52) U.S. Cl.
CPC .............. *H05K 1/028* (2013.01); *H05K 1/0298* (2013.01); *H05K 2201/09527* (2013.01); *H05K 2201/096* (2013.01); *H05K 1/0313* (2013.01); *H05K 1/09* (2013.01)

(58) Field of Classification Search
USPC ......... 174/254, 250, 255, 258, 259, 261, 264, 174/268; 361/679.28, 679.54, 705; 29/852; 427/97.2, 256; 428/141, 447, 629, 704; 430/313
See application file for complete search history.

(56) References Cited

U.S. PATENT DOCUMENTS

| | | | |
|---|---|---|---|
| 5,387,493 A | 2/1995 | Imabayashi et al. | |
| 5,516,989 A | 5/1996 | Uedo et al. | |

(Continued)

FOREIGN PATENT DOCUMENTS

| | | | |
|---|---|---|---|
| JP | 02-106095 A | 4/1990 | |
| JP | 03-138653 A | 6/1991 | |

(Continued)

OTHER PUBLICATIONS

Official Communication issued in International Patent Application No. PCT/JP2012/059515, mailed on Jun. 12, 2012.

*Primary Examiner* — Xiaoliang Chen
(74) *Attorney, Agent, or Firm* — Keating & Bennett, LLP

(57) ABSTRACT

A flexible multilayer substrate includes a multilayer body including a plurality of laminated resin layers. The multilayer body includes an innermost surface, which is a surface on an inner side when the substrate is bent, and an outermost surface, which is a surface on an outer side when the substrate is bent. Each of the plurality of resin layers includes a skin layer on one surface. Lamination of the multilayer body includes a skin layer joint plane at one location at a central portion in the thickness direction, and the skin layer and other surface come in contact with each other at another location along the central portion in the thickness direction. A skin layer joint plane is arranged on a side closer to the innermost surface than a central plane in the thickness direction of the multilayer body.

15 Claims, 6 Drawing Sheets

(56) References Cited

U.S. PATENT DOCUMENTS

| | | | |
|---|---|---|---|
| 5,928,839 A * | 7/1999 | Rath et al. | 430/313 |
| 6,353,189 B1 * | 3/2002 | Shimada et al. | 174/255 |
| 2005/0155792 A1 * | 7/2005 | Ito et al. | 174/264 |
| 2006/0042078 A1 | 3/2006 | Takeuchi et al. | |
| 2012/0138340 A1 | 6/2012 | Kato et al. | |

FOREIGN PATENT DOCUMENTS

| | | |
|---|---|---|
| JP | 07-312469 A | 11/1995 |
| JP | 2004-127970 A | 4/2004 |
| JP | 2006-73763 A | 3/2006 |
| JP | 2007-201263 A | 8/2007 |
| WO | 2011/018979 A1 | 2/2011 |

* cited by examiner

FLEXIBLE MULTILAYER SUBSTRATE

BACKGROUND OF THE INVENTION

1. Field of the Invention

The present invention relates to a flexible multilayer substrate.

2. Description of the Related Art

A flexible multilayer substrate can be produced by laminating resin layers. In some cases, such a flexible multilayer substrate is mounted in a state of being flexed to a certain side. Depending on use, the flexible multilayer substrate may be used in the state of being flexed at the time of mounting, or may be flexed repeatedly during use even if the substrate is not originally flexed at the time of mounting.

An example of a flexible substrate flexed to the same side is disclosed in Japanese Patent Laying-Open No. 2007-201263.

When the flexible multilayer substrate is used in the flexed state or is flexed repeatedly during use, there is a problem of separation at a joint plane of via conductors or resin layers in the flexible multilayer substrate.

SUMMARY OF THE INVENTION

Therefore, preferred embodiments of the present invention provide a flexible multilayer substrate capable of significantly reducing or preventing separation problems during use in the flexed state.

A flexible multilayer substrate according to a preferred embodiment of the present invention includes a multilayer body including a plurality of laminated resin layers. The multilayer body includes an innermost surface, which is a surface on an inner side when the substrate is bent, and an outermost surface, which is a surface on an outer side when the substrate is bent. Each of the plurality of resin layers includes a first main surface and a second main surface opposite to each other. A skin layer is provided in a vicinity of the first main surface and the skin layer is harder than other portions of the resin layer. A conductor pattern is located on the second main surface. Lamination of the multilayer body includes a skin layer joint plane, which is a plane at which the first main surfaces of two of the resin layers adjacent to each other come into contact, at one central location in a thickness direction, and the first main surface and the second main surface of two of the resin layers come into contact at other location at the central location in the thickness direction of the multilayer body. The skin layer joint plane is located on a side closer to the innermost surface than a central plane in the thickness direction of the multilayer body. With this configuration, the skin layer joint plane is in a compressed state rather than a stretched state, so that separation caused by the skin layer joint plane becomes much less likely to occur or is prevented.

Preferably, in a preferred embodiment of the present invention, a first resin layer and a second resin layer adjacent to each other over the skin layer joint plane respectively include via conductors penetrating in the thickness direction to electrically connect the first main surface and the second main surface. Each of the via conductors has a tapered shape with a diameter in the first main surface greater than a diameter in the second main surface. The via conductor of the first resin layer and the via conductor of the second resin layer are in contact so as to be opposite to each other at the skin layer joint plane in a bent portion of the multilayer body. With this configuration, the joint portion of the via conductors, which is generally likely to be a starting point of separation of resin, is located on an inner side of the flexed substrate. Therefore, a vicinity of the joint portion is in the compressed state, so that the separation becomes less likely to occur or is prevented.

Preferably, in a preferred embodiment of the present invention, the skin layer joint plane is positioned between a first resin layer and a second resin layer from the innermost surface. With this configuration, the skin layer joint plane is an innermost joint plane when the flexible multilayer substrate is flexed, so that a particularly great effect is obtained which to significantly reduce or prevent separation caused by the skin layer joint plane.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
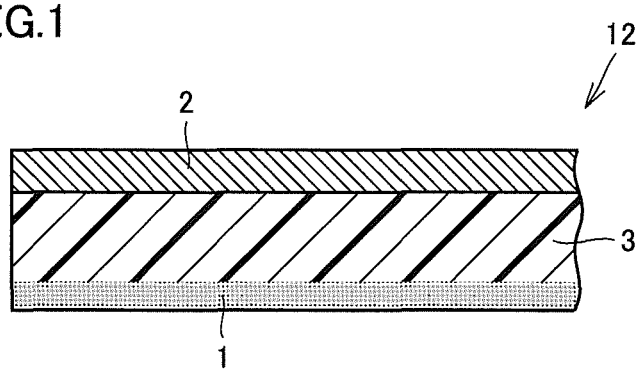
FIG. 1 is a partial cross-sectional view of a resin sheet with metal foil studied by the inventors.

The inventors focused their development activity on providing a skin layer in a resin sheet with metal foil used when producing a flexible multilayer substrate. As shown in FIG. 1, a resin sheet 12 with metal foil includes one surface provided with metal foil 2. A surface layer portion on a surface of the side having no metal foil 2 is provided with a skin layer 1. Here, the "skin layer" is a surface layer portion made of the resin material which is the same as resin constituting a major portion of the resin sheet, but having a resin compound orientation different from that of other portions and consequently being hard only at the surface layer portion.

Figure 2:
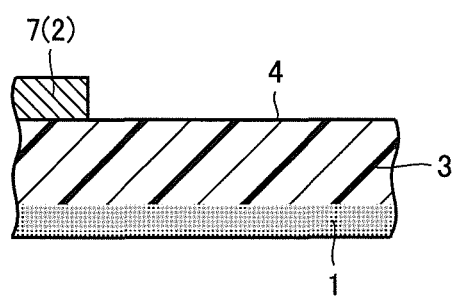
FIG. 2 is a partial cross-sectional view showing a state where an unnecessary portion of the metal foil of the resin sheet with metal foil studied by the inventors is removed by etching.

At the surface of the resin sheet where metal foil 2 is provided, the skin layer is almost broken due to attachment of metal foil 2 to the resin sheet, thus almost no skin layer is present. Unnecessary portions of the metal foil at this surface preferably are removed by etching to form a conductor pattern. In a region where the conductor pattern is not present on the surface where conductor pattern 7 is formed as shown in FIG. 2, almost no skin layer is present. Therefore, in this region, resin 4 in the state of not being influenced by the skin layer (hereinafter, referred to as "non-skin layer resin surface") is exposed.

On the other hand, skin layer 1 remains on the opposite side surface, and no new conductor pattern is generally provided on skin layer 1. Therefore, when laminating the resin sheets, skin layer 1 and non-skin layer resin surface 4 are joined as shown in FIG. 3 as long as the resin sheets are laminated with the front and back sides oriented in the same direction.

Figure 3:
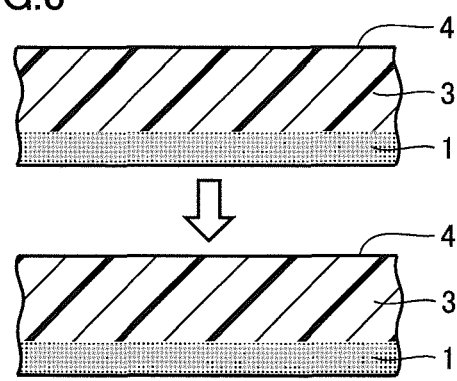
FIG. 3 is a first explanatory drawing related to a multilayer of resin sheets studied by the inventors.
Figure 4:
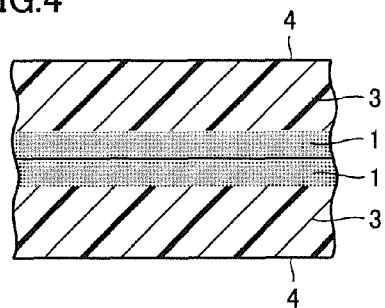
FIG. 4 is a second explanatory drawing related to the multilayer of resin sheets studied by the inventors.

The inventors focused their development efforts on the discovery that the plane at which skin layers 1 are joined together as shown in FIG. 4 has a weaker adhesion as compared to the plane at which skin layer 1 and non-skin layer resin surface 4 are joined together as shown in FIG. 3.

Figure 5:
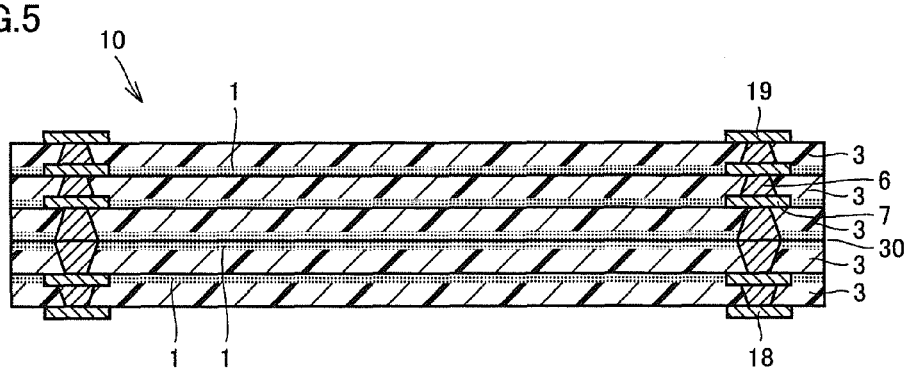
FIG. 5 is a cross-sectional view of a flexible multilayer substrate studied by the inventors.

As shown in FIG. 5, a flexible multilayer substrate 10 is configured as a multilayer body of a plurality of resin layers 3. Many of resin layers 3 included in flexible multilayer substrate 10 generally have via conductors 6 that penetrate in the thickness direction. When seeking to expose conductor pattern 7 on both of the uppermost surface and the lowermost surface of multilayer body as external electrodes 18, 19, it is necessary to reverse the front and back of the resin sheet at some plane in a central portion of the multilayer body. Therefore, a plane 30 where skin layers are joined together (hereinafter, referred to as "skin layer joint plane") is provided on at least one location. In other words, on at least one location in a central location in the thickness direction of the multilayer body of flexible multilayer substrate 10, there is provided a portion having a weaker adhesion than other portions. The inventors developed preferred embodiments of the present invention based on such discoveries.

First Preferred Embodiment

Figure 6:
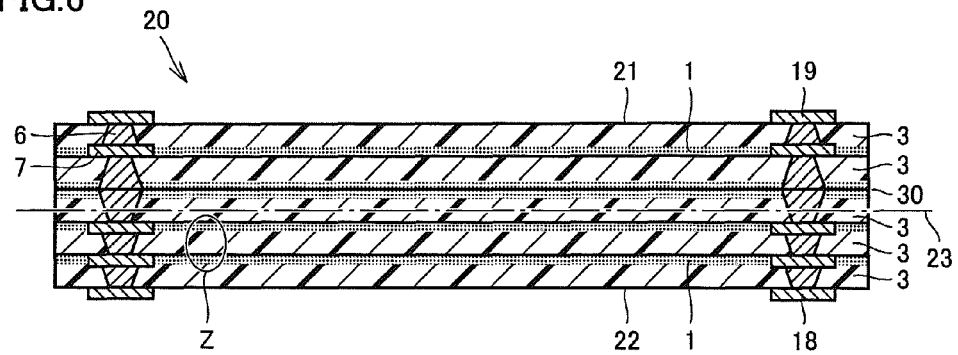
FIG. 6 is a cross-sectional view of a flexible multilayer substrate in accordance with a first preferred embodiment of the present invention.
Figure 7:
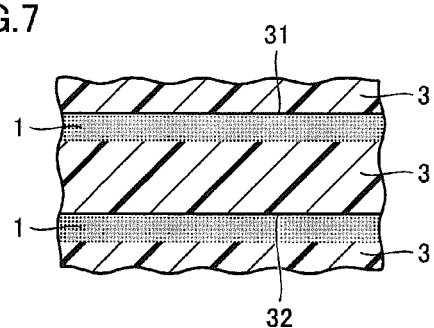
FIG. 7 is an enlarged view of a Z portion shown in FIG. 6.

Referring to FIGS. 6 and 7, a flexible multilayer substrate in accordance with a first preferred embodiment of the present invention will be described. As shown in FIG. 6, a flexible multilayer substrate 20 in accordance with the present preferred embodiment includes a multilayer body including a plurality of laminated resin layers 3. This multilayer body includes an innermost surface 21, which is a surface on an inner side when the substrate is bent, and an outermost surface 22, which is a surface on an outer side when the substrate is bent. FIG. 7 represents an enlarged view of a Z portion shown in FIG. 6. Each of the plurality of resin layers 3 includes a first main surface 31 and a second main surface 32 opposite to each other. In FIG. 7, the upper surface of resin layer 3 shown in the center is first main surface 31, and the lower surface is second main surface 32. A skin layer 1 is provide in the vicinity of first main surface 31. The skin layer 1 is harder than other portions of resin layer 3. On second main surface 32, conductor pattern 7 is arranged as shown in FIG. 6. This multilayer body includes skin layer joint plane 30, which is a plane at which first main surfaces 31 of resin layer 3 adjacent to each other come into contact, at one location in a central portion in the thickness direction. At other portions in the central portion in the thickness direction of the multilayer body, first main surface 31 and second main surface 32 of resin layers 3 adjacent to each other are laminated so as to be in contact. As shown in FIG. 6, skin layer joint plane 30 is arranged on a side closer to innermost surface 21 than a central plane 23 in the thickness direction of the multilayer body.

In the example shown in FIG. 6, all of resin layers 3 included in the multilayer body are provided with via conductors 6 so as to penetrate in the thickness direction, and conductor pattern 7 is provided on one surface of resin layer 3.

The rules for illustration of the conductor pattern in FIG. 6 will be described. Similar rules as to the illustration of the conductor pattern are applied also to other cross-sectional views. In FIG. 6, conductor pattern 7 provided on an upper surface or a lower surface of each resin layer 3 included in the multilayer body is illustrated as being provided on an outer side of each resin layer 3 and buried in adjacent resin layer 3, rather than being illustrated inside of each resin layer 3 itself. Therefore, resin layer 3 surrounded by an oval of the Z portion in FIG. 6 includes conductor pattern 7 on the lower surface, and does not have a conductor pattern on the upper surface. In FIG. 6, the conductor pattern appearing to be provided on the upper surface of resin layer 3 surrounded by the oval of the Z portion is conductor pattern 7 attached to the lower surface of resin layer 3 adjacent on the upper side.

In the present preferred embodiment, skin layer joint plane 30, which is a surface having a weaker adhesion than other portions in the multilayer body of the resin layer, is arranged on a side closer to innermost surface 21 than central plane 23 in the thickness direction of the multilayer body. Therefore, when flexible multilayer substrate 20 is flexed, skin layer joint plane 30 is positioned on an inner side of the flexed state. Thus, skin layer joint plane 30 is rendered to be in a compressed state rather than a stretched state. Consequently, the separation caused by skin layer joint plane 30 becomes less likely to occur or is prevented. Even when the separation occurs, the separated portions are pushed against each other in the compressed state. Therefore, extension of the separation is prevented.

Second Preferred Embodiment

Figure 8:
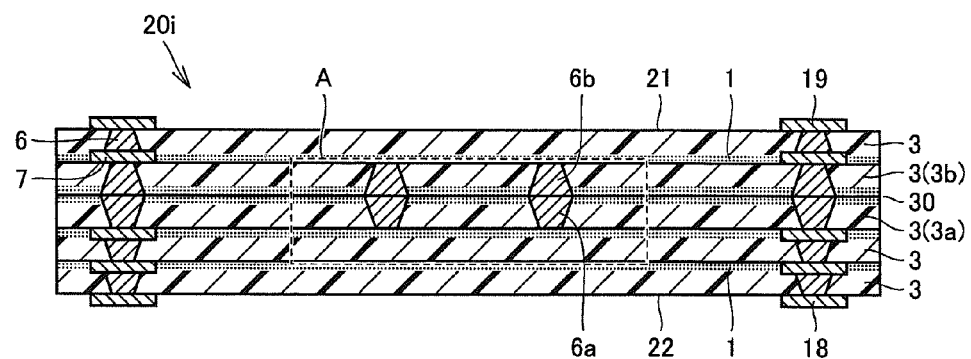
FIG. 8 is a cross-sectional view of a flexible multilayer substrate in accordance with a second preferred embodiment of the present invention.
Figure 9:
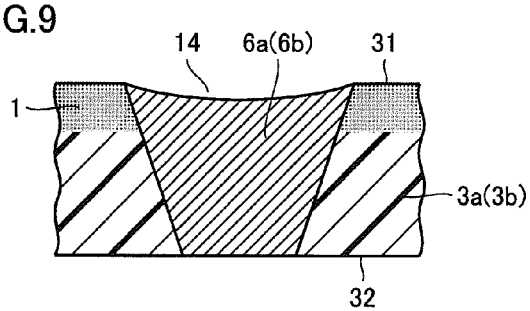
FIG. 9 is a cross-sectional view showing the state where the via conductor and its vicinity included in the flexible multilayer substrate in accordance with the second preferred embodiment of the present invention are removed.
Figure 11:
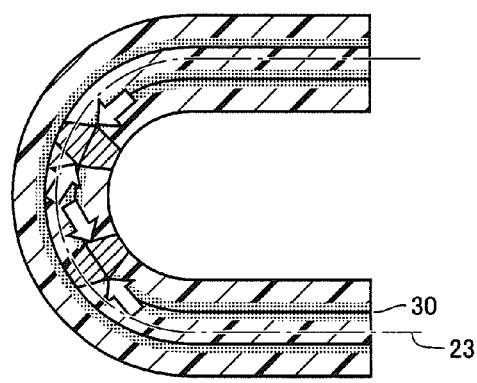
FIG. 11 is an explanatory drawing showing the state in the A portion when the flexible multilayer substrate in accordance with the second preferred embodiment of the present invention is flexed.

Referring to FIG. 8, a flexible multilayer substrate 20i in accordance with a second preferred embodiment of the present invention will be described. The basic configuration of flexible multilayer substrate 20i in accordance with the present preferred embodiment preferably is similar to that of flexible multilayer substrate 20 described in the first preferred embodiment. However, flexible multilayer substrate 20i is different in expressly including via conductors inside. In flexible multilayer substrate 20i in accordance with the present preferred embodiment, a first resin layer 3a and a second resin layer 3b adjacent to each other over skin layer joint plane 30 respectively have via conductors 6a, 6b penetrating in the thickness direction so as to electrically connect the first main surface and the second main surface. FIG. 9 represents the location of first resin layer 3a where the vicinity of via conductor 6a is taken out. The vicinity of via conductor 6b of second resin layer 3b also has a similar structure except for being upside down. As shown in FIG. 9, each of via conductors 6a, 6b has a tapered shape having a diameter at first main surface 31 greater than a diameter at second main surface 32. As shown in FIG. 8, at skin layer joint plane 30 in a bent portion of the multilayer body, via connector 6a of first resin layer 3a and via conductor 6b of second resin layer 3b come in contact so as to be opposite to each other. The portion where via conductor 6a and via conductor 6b come in contact so as to be opposite to each other corresponds to the bent portion of flexible multilayer substrate 20i as shown in FIG. 11 described later.

Figure 10:
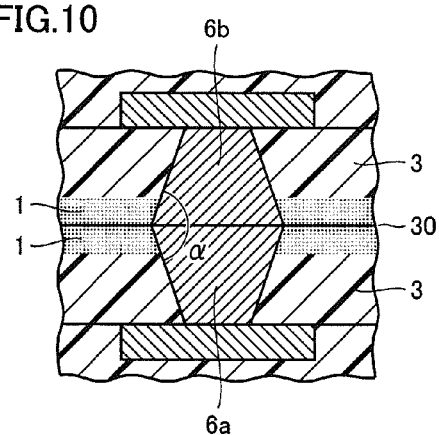
FIG. 10 is an explanatory drawing of the joint portion of the via conductors included in the flexible multilayer substrate in accordance with the second preferred embodiment of the present invention.

In the present preferred embodiment, first resin layer 3a and second resin layer 3b adjacent to each other over skin layer joint plane 30 respectively include via conductors 6a, 6b, and via conductors 6a, 6b preferably have a tapered shape as described above. Therefore, as shown in FIG. 10, an angle α represented in the cross-sectional view is preferably smaller than 180°, for example. In other words, it is a corner protruding toward an outer peripheral side. In such location where the diameter is wide toward the outer peripheral side at the joint plane of the via conductors, separation of resin layer 3 is relatively likely to occur generally at the corner, where the via conductors come in contact with each other, as a starting point. However, in the present preferred embodiment, skin layer joint plane 30 is arranged on a side closer to innermost surface 21 than central plane 23 in the thickness direction of the multilayer body. In other words, the corners at which the via conductors come in contact with each other are also arranged on a side closer to innermost surface 21 than central plane 23 in the thickness direction of the multilayer body. Therefore, when this flexible multilayer substrate 20i is flexed, the corners at which the via conductors come in contact with each other are positioned inside the flexed state. Focusing on the A portion in FIG. 8, FIG. 11 represents the state where flexible multilayer substrate 20i is flexed. The A portion includes the bent portion of flexible multilayer substrate 20i. The corners at which the via conductors come in contact with each other are positioned inside the flexed shape. Therefore, as shown in FIG. 11, the vicinity of the corners at which the via conductors come in contact with each other is in a compressed state. Consequently, separation of resin layers 3 at the corner where the via conductors come in contact with each other, as a starting point becomes less likely to occur or is prevented. Even when the separation occurs, the separated portions are pushed against each other in the compressed state. Therefore, extension of the separation is significantly reduced or prevented.

Further, as shown in FIG. 9, a recess 14 is likely to occur at a surface on a side where via conductors 6a, 6b have greater diameter. As shown in FIG. 10, at the location where via conductors 6a, 6b are joined together over skin layer joint plane 30, surfaces having recess 14 are joined together. Therefore, the adhesion is originally poor, and separation is likely to occur. However, in the present preferred embodiment, since such a joint plane is positioned inside the flexed shape, the vicinity of this joint plane is in the compressed state. Consequently, separation at the plane, where the surfaces including recess 14 are joined together, as a starting point becomes less likely to occur or is prevented.

Third Preferred Embodiment

Figure 12:
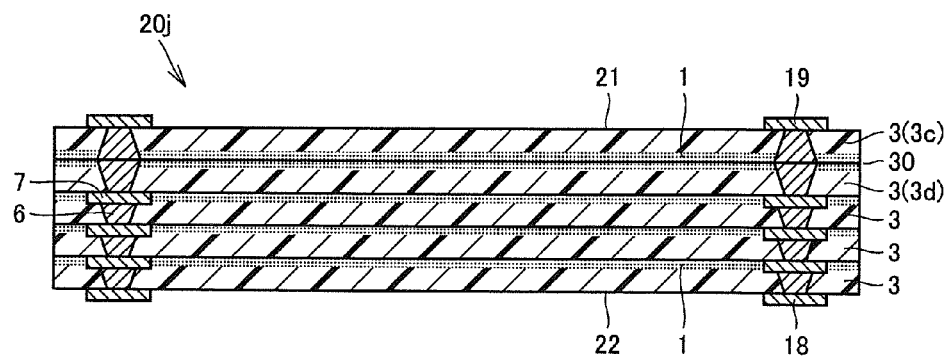
FIG. 12 is a cross-sectional view of a flexible multilayer substrate in accordance with a third preferred embodiment of the present invention.

Referring to FIG. 12, a flexible multilayer substrate 20j in accordance with the third preferred embodiment of the present preferred embodiment will be described. The basic configuration of flexible multilayer substrate 20j in accordance with the present preferred embodiment preferably is similar to that of the flexible multilayer substrates described in the first and second preferred embodiments. In flexible multilayer substrate 20j in accordance with the present preferred embodiment, as shown in FIG. 12, skin layer joint plane 30 is positioned between a first resin layer 3c and a second resin layer 3d from innermost surface 21.

In the present preferred embodiment, skin layer joint plane 30, which is a surface having a weaker adhesion than other portions in the multilayer body of the resin layers, is an innermost joint plane when flexible multilayer substrate 20j is flexed. Therefore, when flexible multilayer substrate 20j is flexed with innermost surface 21 provided inside, skin layer joint plane 30 of some joint planes of resin layers 3 present in the multilayer body is in the most remarkable compressed state. Therefore, in the present preferred embodiment, a particularly great effect of preventing separation caused by skin layer joint plane 30 is obtained.

Fourth Preferred Embodiment

Referring to FIGS. 13 to 18, an example of a method for manufacturing a flexible multilayer substrate in accordance with a fourth preferred embodiment of the present preferred embodiment will be described.

Figure 13:
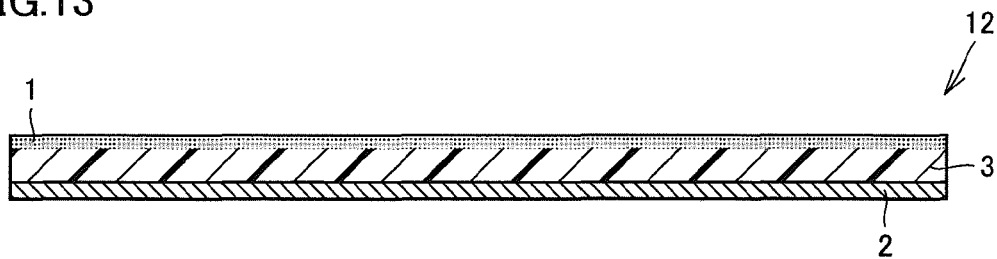
FIG. 13 is an explanatory drawing showing a first step of an example of a method for manufacturing a flexible multilayer substrate in accordance with a fourth preferred embodiment of the present invention.

Firstly, resin sheet 12 with metal foil as shown in FIG. 13 is prepared. Resin sheet 12 with metal foil is a sheet having a structure in which metal foil 2 adheres to one surface of resin layer 3. Resin layer 3 is preferably made of, for example, LCP (liquid crystal polymer) which is a thermoplastic resin. Other than LCP, the material of resin layer 3 may be PEEK (polyetheretherketone), PEI (polyetherimide), PPS (polyphenylenesulfide), PI (polyimide), and the like, for example. Metal foil 2 preferably is foil, for example, made of Cu and having a thickness of about 18 μm. Other than Cu, the material of metal foil 2 may be Ag, Al, SUS, Ni, and Au, or may be an alloy of two or more different kinds of metals selected from these metals, for example. In the present preferred embodiment, metal foil 2 preferably has a thickness of about 18 μm, for example. However, the thickness of metal foil 2 may be about 3-40 μm, for example. Metal foil 2 preferably has a thickness enabling circuit formation.

Figure 14:
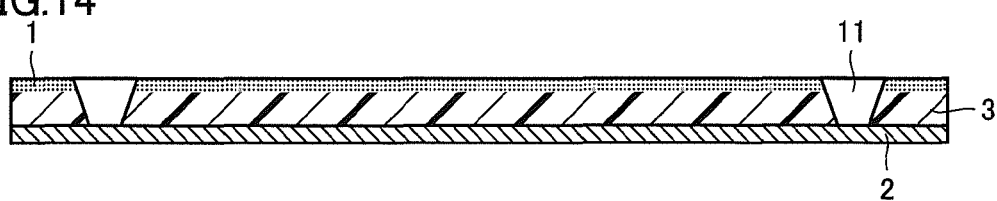
FIG. 14 is an explanatory drawing showing a second step of the example of the method for manufacturing the flexible multilayer substrate in accordance with the fourth preferred embodiment of the present invention.

As shown in FIG. 14, a carbon dioxide laser beam is irradiated to a surface on the side of resin layer 3 of resin sheet 12 with metal foil to form a via hole 11 so as to penetrate through resin layer 3. Via hole 11 penetrates through resin layer 3 but does not penetrate through metal foil 2. After that, a smear (not illustrated) of via hole 11 is removed. Here, the carbon dioxide laser beam is used to form via hole 11. However, other type of laser beam may be used. Further, a method other than using the laser beam irradiation may be used to form via hole 11.

Figure 15:
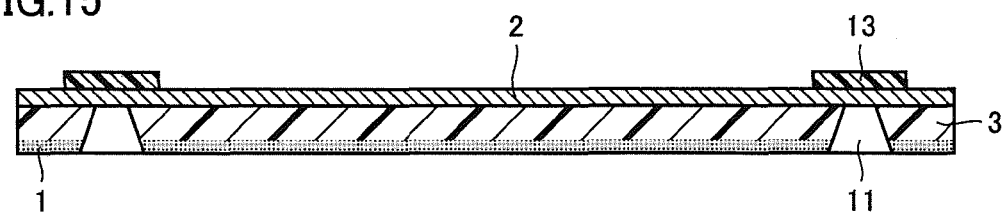
FIG. 15 is an explanatory drawing showing a third step of the example of the method for manufacturing the flexible multilayer substrate in accordance with the fourth preferred embodiment of the present invention.

Next, as shown in FIG. 15, a resist pattern 13 corresponding to a desired circuit pattern is printed by a method such as screen printing on the surface of metal foil 2 of resin sheet 12 with metal foil. FIG. 15 represents an upside down image as compared to FIG. 14.

Figure 16:
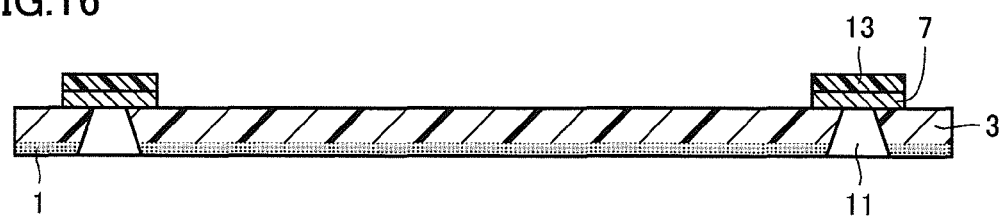
FIG. 16 is an explanatory drawing showing a fourth step of the example of the method for manufacturing the flexible multilayer substrate in accordance with the fourth preferred embodiment of the present invention.
Figure 17:
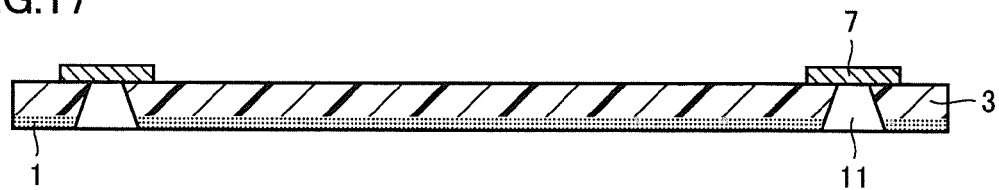
FIG. 17 is an explanatory drawing showing a fifth step of the example of the method for manufacturing the flexible multilayer substrate in accordance with the fourth preferred embodiment of the present invention.

Next, etching is performed with resist pattern 13 as a mask, and then the portion not covered with resist pattern 13 on metal foil 2 is removed as shown in FIG. 16. As to metal foil 2, the portion remaining after this etching is referred to as "conductor pattern 7." After that, as shown in FIG. 17, resist pattern 13 is removed. In such a manner, desired conductor pattern 7 is obtained on one surface of resin layer 3.

Figure 18:
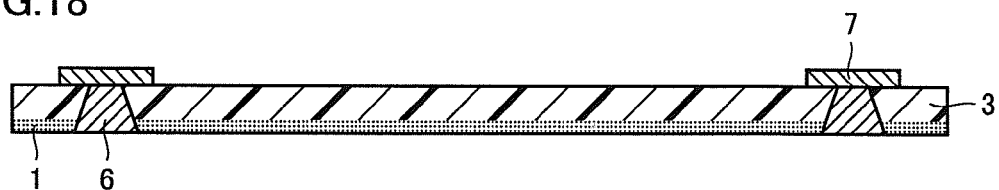
FIG. 18 is an explanatory drawing showing a sixth step of the example of the method for manufacturing the flexible multilayer substrate in accordance with the fourth preferred embodiment of the present invention.

Next, as shown in FIG. 18, via hole 11 is filled with conductive paste by screen printing and the like. In such a manner, via conductors 6 are formed. The screen printing is performed from the lower side surface in FIG. 17. In FIGS. 17 and 18, for convenience of description, via hole 11 is illustrated in the downward orientation. However, the screen printing may be eventually performed after changing the orientation appropriately. The conductive paste to be filled may contain silver as a main component as described above. However, it may contain copper as a main component, alternatively. This conductive paste preferably contains an appropriate amount of metal powder forming an alloy layer with metal which is material of conductor pattern 7 at a temperature of performing thermo-compression bonding (hereinafter, referred to as "thermo-compression bonding temperature") with respect to the resin layer laminated later. Since this conductive paste contains copper, in other words, Cu as a main component for exerting conductivity, this conductive paste preferably contains, other than the main component, at least one kind selected from Ag, Cu, and Ni, and at least one kind selected from Sn, Bi, and Zn.

Further, performing lamination and compression bonding with use of this structure body provides, for example, flexible multilayer substrate 20 shown in FIG. 6. Other multilayer substrates illustrated in the preferred embodiments above can also be produced by appropriately changing the orientation of stacking during lamination or appropriately forming via conductors in an intermediate portion. Conductor patterns 7 arranged on the lower surface and the upper surface of the flexible multilayer substrate become external electrodes 18, 19, respectively. The compression bonding may be performed once collectively, or may be performed twice including pre-bonding and primary bonding.

In each of the preferred embodiments described above, description was made based on the assumption that the number of resin layers 3 included in the flexible multilayer substrate is five, for example. However, the number of resin layers may be other than five.

In each of the preferred embodiments described above, description was made based on the assumption that the flexible multilayer substrate preferably has a constant thickness at any portion. However, different portions of the flexible multilayer substrate may have different thicknesses.

As thus far described, the product according to various preferred embodiments of the present invention is a flexible multilayer substrate. However, the present invention is not limited to a multilayer substrate which is flexible in the entire region. The present invention can be applied to an inner portion of the flexible portion even if the multilayer substrate partially includes a rigid portion as long as the multilayer substrate includes a flexible portion.

It should be understood that the preferred embodiments disclosed herein are illustrative and non-restrictive in every respect. The scope of the present invention is defined by the terms of the claims, rather than the description of the preferred embodiments set forth above, and is intended to include any modifications within the scope and meaning equivalent to the terms of the claims.

Preferred embodiments of the present invention can be used for a flexible multilayer substrate, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible multilayer substrate comprising:
a multilayer body including a plurality of laminated resin layers; wherein
the multilayer body includes an innermost surface located on an inner side when the substrate is bent and an outermost surface located on an outer side when the substrate is bent;
each of the plurality of resin layers includes a first main surface and a second main surface opposite to each other, and a skin layer is provided at the first main surface and is harder than other portions of the resin layer, and a conductor pattern is provided on the second main surface of the resin layer;
the multilayer body includes a skin layer joint plane, which is a plane at which the first main surfaces of two of the resin layers adjacent to each other come into contact, at one location at a central portion in a thickness direction, and the first main surface and the second main surface of two of the adjacent resin layers come into contact at another location of the central portion in the thickness direction of the multilayer body; and
the skin layer joint plane is arranged on a side closer to the innermost surface than a central plane in the thickness direction of the multilayer body.

2. The flexible multilayer substrate according to claim 1, wherein a first resin layer and a second resin layer of the plurality of laminated resin layers, which are adjacent to each other over the skin layer joint plane, respectively include via conductors penetrating in the thickness direction to electrically connect the first main surface and the second main surface.

3. The flexible multilayer substrate according to claim 2, wherein each of the via conductors has a tapered shape with a diameter in the first main surface that is greater than a diameter in the second main surface.

4. The flexible multilayer substrate according to claim 2, wherein the via conductor of the first resin layer and the via conductor of the second resin layer are in contact so as to be opposite to each other at the skin layer joint plane in a bent portion of the multilayer body.

5. The flexible multilayer substrate according to claim 2, wherein corners at which the via conductors come in contact with each other are arranged on a side closer to the innermost surface than the central plane in the thickness direction of the multilayer body.

6. The flexible multilayer substrate according to claim 2, wherein corners at which the via conductors come in contact with each other are located inside a flexed shape of the substrate when the substrate is flexed.

7. The flexible multilayer substrate according to claim 1, wherein the skin layer joint plane is located between a first resin layer and a second resin layer of the plurality of laminated resin layers and extends from the innermost surface.

8. The flexible multilayer substrate according to claim 1, wherein all of the resin layers included in the multilayer body are provided with via conductors so as to penetrate in the thickness direction.

9. The flexible multilayer substrate according to claim 1, wherein the skin layer joint plane defines an innermost joint plane when the substrate is flexed.

10. The flexible multilayer substrate according to claim 1, wherein a number of the plurality of laminated resin layers is at least five.

11. The flexible multilayer substrate according to claim 1, wherein the flexible multilayer substrate has a constant thickness along all portions thereof.

12. The flexible multilayer substrate according to claim 1, wherein different portions of the flexible multilayer substrate have different thicknesses.

13. The flexible multilayer substrate according to claim 1, further comprising a rigid portion provided in the multilayer body.

14. The flexible multilayer substrate according to claim 1, wherein the plurality of laminated resin layers are made of one of a liquid crystal polymer, polyetheretherketone, polyetherimide, polyphenylenesulfide, and polyimide.

15. The flexible multilayer substrate according to claim 1, wherein the conductor pattern is made of one of Cu, Ag, Al, SUS, Ni, Au, and an alloy of at least two of Cu, Ag, Al, SUS, Ni, Au.

* * * * *